United States Patent [19]

Beall

[11] Patent Number: 5,920,230
[45] Date of Patent: Jul. 6, 1999

[54] HEMT-HBT CASCODE DISTRIBUTED AMPLIFIER

[75] Inventor: Wendell G. Beall, Torrance, Calif.

[73] Assignee: TRW Inc., Redondo Beach, Calif.

[21] Appl. No.: 08/955,379

[22] Filed: Oct. 21, 1997

[51] Int. Cl.[6] .............. H03F 3/60; H03F 3/16; H03F 3/68
[52] U.S. Cl. ............ 330/54; 330/277; 330/295
[58] Field of Search ............ 330/54, 277, 286, 330/295, 300, 311

[56] References Cited

U.S. PATENT DOCUMENTS

| | | | |
|---|---|---|---|
| 4,276,515 | 6/1981 | Nishimoto | 330/253 |
| 4,550,291 | 10/1985 | Millaway et al. | 330/277 |
| 4,586,004 | 4/1986 | Valdez | 330/300 |
| 4,688,267 | 8/1987 | Chown et al. | 455/619 |
| 4,757,276 | 7/1988 | Ishii et al. | 330/278 |
| 4,839,609 | 6/1989 | Hara et al. | 330/293 |
| 4,901,031 | 2/1990 | Kalthoff et al. | 330/253 |
| 4,992,752 | 2/1991 | Cioffi | 330/54 |
| 5,032,799 | 7/1991 | Milberger et al. | 330/311 |
| 5,061,903 | 10/1991 | Vaslie | 330/311 |
| 5,066,926 | 11/1991 | Ramachandran et al. | 330/311 |
| 5,144,266 | 9/1992 | Dougherty et al. | 333/1 |
| 5,227,734 | 7/1993 | Schindler et al. | 330/54 |
| 5,274,342 | 12/1993 | Wen et al. | 330/295 |
| 5,304,869 | 4/1994 | Greason | 307/446 |
| 5,459,433 | 10/1995 | Fenk et al. | 330/254 |

FOREIGN PATENT DOCUMENTS 460562   2/1937   United Kingdom .

OTHER PUBLICATIONS

"Integrated Circuit Tuned Amplifier", *Integrated Electronics*, Sec. 16–9, pp. 558–564.

"A Cascode Video Amplifier", *Integrated Electronics*, Sec. 16–10, pp. 565–567.

"On Gain–Bainwidth Product for Distributed Amplifiers", by R.C. Becker and J.B. Beyer.

*IEEE Transactions on Microwave Theory and Techniques*, vol. MTT–34, No. 6, Jun. 1986, pp. 736–738.

"Distributed Amplication", by E.L. Ginzton, W.R.Hewlett, J.H.Jasberg and J.D. Noe.

*Proceedings of the I.R.E.*, Aug. 1948, pp. 956–969.

"Wideband Additive Amplifiers", *Pentode Distributed Amplifiers*, Chap. 13, pp. 334–358.

"MESFET Distributed Amplifier Design Guidelines", by J.B. Beyer, S.N. Prasad, R.C. Becker, J. E. Nordmann, and G,K, Hohenwarter,

*IEEE Transactions on Microwave Theory and Techniques*, vol. MTT–32, No. 2, Mar. 1984, pp. 268–275.

*Primary Examiner*—Robert Pascal
*Assistant Examiner*—Patricia Nguyen
*Attorney, Agent, or Firm*—Michael S. Yatsko

[57] ABSTRACT

A distributed amplifier formed from high electron mobility transistors (HEMTs) and a heterojunction bipolar transistor (HBT) configured in a cascode arrangement in which a common source FET, such as a high electron mobility transistors (HEMTs), is used to drive a heterojunction bipolar transistor (HBT) in a common base configuration which provides increased RF output power relative to known all-HEMT distributed amplifiers.

15 Claims, 3 Drawing Sheets

HEMT-HBT CASCODE DISTRIBUTED AMPLIFIER

BACKGROUND OF THE INVENTION

1. Field of the Invention

The present invention relates to a distributed amplifier and, more particularly, to a distributed amplifier formed from a high electron mobility transistor (HEMT) and a heterojunction bipolar transistor (HBT) configured in a cascode arrangement which, by virtue of the HBT's high breakdown voltage, provides relatively higher output power relative to known distributed amplifiers; the HEMT/HBT cascode being suitable to being formed as a monolithic microwave integrated circuit (MMIC).

2. Description of the Prior Art

Distributed amplifiers are known to be used for wide bandwidth applications. Examples of early distributed amplifiers formed with vacuum tubes are disclosed in: "Distributed Amplification", by F. L. Ginzton, W. R. Hewlett, J. H. Jasberg, and J. D. Noe, *PROC. IRE*, Vol. 36, pp. 956–969, August 1948; "Principles and Design of Linear Active Circuits", by M. S. Ghausi, Ch. 13, McGraw-Hill 1965; and British Patent No. 460,562, January 1937. With the development of the transistor, the vacuum tubes in the distributed amplifier circuits were replaced with common source field effect transistors (FET), for example, as disclosed in: "MESFET Distributed Amplifier Design Guidelines", by J. P. Beyer, S. N. Prasad, R. C. Becker, J. E. Nordman, and G. K. Hohenwarter, *IEEE Transactions on Microwave Theory and Techniques*, Vol. MTT-32, No. 3, March 1984, pp. 268–275; and "On Gain-Bandwidth Product for Distributed Amplifiers", by R. C. Becker and J. B. Beyer, *IEEE Transactions on Microwave Theory in Techniques*, Vol. MTT-34, No. 6, June 1986, pp. 736–738, and as generally shown in FIG. 1. For simplicity, the gate and drain (collector) bias voltages for the distributed amplifier has been ignored as have the capacitors for AC grounding of the line termination resistors. The bias voltage and grounding capacitors are known in the art and are unnecessary to an understanding of the invention.

Referring to FIG. 1, a plurality of FETs, 4 for example, 22, 24, 26 and 28, are connected in a common source configuration. In the configuration shown in FIG. 1, input and output capacitances for each of the FETs 22, 24, 26 and 28, are combined with inductances 34–52 to form artificial transmission lines, generally identified with the reference numerals 30 and 32. The drain terminals of all the FETs 22, 24, 26 and 28 are coupled together by way of the lumped or distributed inductances or transmission lines 34, 38, 42, and 46 and connected to an AC ground by way of a drain line termination impedance represented as the resistor $R_{DT}$, which is generally chosen to match the characteristic impedance of the output line. The gate terminals of each of the FETs 22, 24, 26 and 28 are coupled together by way of the inductances 40, 44, 48 and 52 and terminated to an AC ground by way of a gate line termination resistance, illustrated as $R_{gt}$, selected to be relatively equal to the characteristic impedance of the input transmission line. While such common source FET distributed amplifiers are able to provide a relatively flat, low-pass response up to relatively high frequencies, such amplifiers are known to have drawbacks. For example, with such a configuration, the performance of the amplifier can be improved by increasing the transconductance of the FETs. Unfortunately, measures to increase the transconductance $g_m$ by increasing either the bias current and/or increasing the gate width also increase the output conductance $g_o$. Unfortunately, increase in the output conductance $g_o$ can cause significant losses in the output line, thereby limiting the number of stages which can be used in the distributed chain, as well as reducing the gain-bandwidth product of the amplifier. Another problem with such common source distributed amplifiers relates to the gate-drain capacitances of the FETs which cause parasitic feedback from the output to the input. The feedback, known as the Miller effect, makes the devices non-unilateral at higher frequencies, causing various problems, including a reduced gain-bandwidth product, response ripple, and poor isolation.

In order to solve the various problems associated with common source FET distributed amplifiers, a cascode configured device, as generally illustrated in FIG. 2, and generally identified with the reference numeral 54 was developed. The known distributed amplifier 54, shown without bias voltage and capacitors for grounding the line termination resistors for simplicity as discussed above, is shown with four stages, for example. Each stage includes a pair of FETs 56, 58, 60, 62, 64, 66, 68, and 70, connected in a cascode configuration. In such a cascode configuration, the FETs 58, 62, 66 and 70 are connected in a common source configuration and are used to drive the FETs 56, 60, 64 and 68, which, in turn, are connected in a common gate configuration. The drain terminals of the FETs 56, 60, 64 and 68, are coupled together by way of the lumped inductances 72, 76, 80 and 84 and connected to an AC ground by way of a drain line termination resistance $R_{DT}$. The gate terminals of the FETs 58, 62, 66 and 70 are coupled together by way of the inductances 78, 82, 86 and 90 and connected to an AC ground by way of a gate line termination resistance $R_{gt}$. The gate terminals each of the FETs 56, 60, 64 and 68, are coupled together and connected to an AC ground by way of a capacitor 92.

The cascode configuration illustrated in FIG. 2 has an output resistance as a result of the common gate configuration that is much higher than a comparable common source device as illustrated in FIG. 1, which allows for a higher transconductance $g_m$ without degrading the output line by way of a large output conductance $g_o$. Unfortunately, some FETs (especially HEMTs) have relatively low gate-to-drain breakdown voltages (i.e., 3–7 v.) which constrains the output voltage swing to be relatively small, which limits the RF output power which can be achieved across a 50 W load.

SUMMARY OF THE INVENTION

It is yet another object of the present invention to provide a distributed amplifier with increased RF output power relative to known distributed amplifiers.

Briefly, the present invention relates to a distributed amplifier formed from a high electron mobility transistor (HEMT) and a heterojunction bipolar transistor (HBT) configured in a cascode arrangement in which a common source FET, such as HEMT is used to drive an HBT in a common base configuration in order to provide increased RF output power relative to known distributed amplifiers.

BRIEF DESCRIPTION OF THE DRAWING

These and other objects of the present invention will be readily understood with reference to the following specification and attached drawings, wherein.

DETAILED DESCRIPTION OF THE INVENTION

Figure 3:
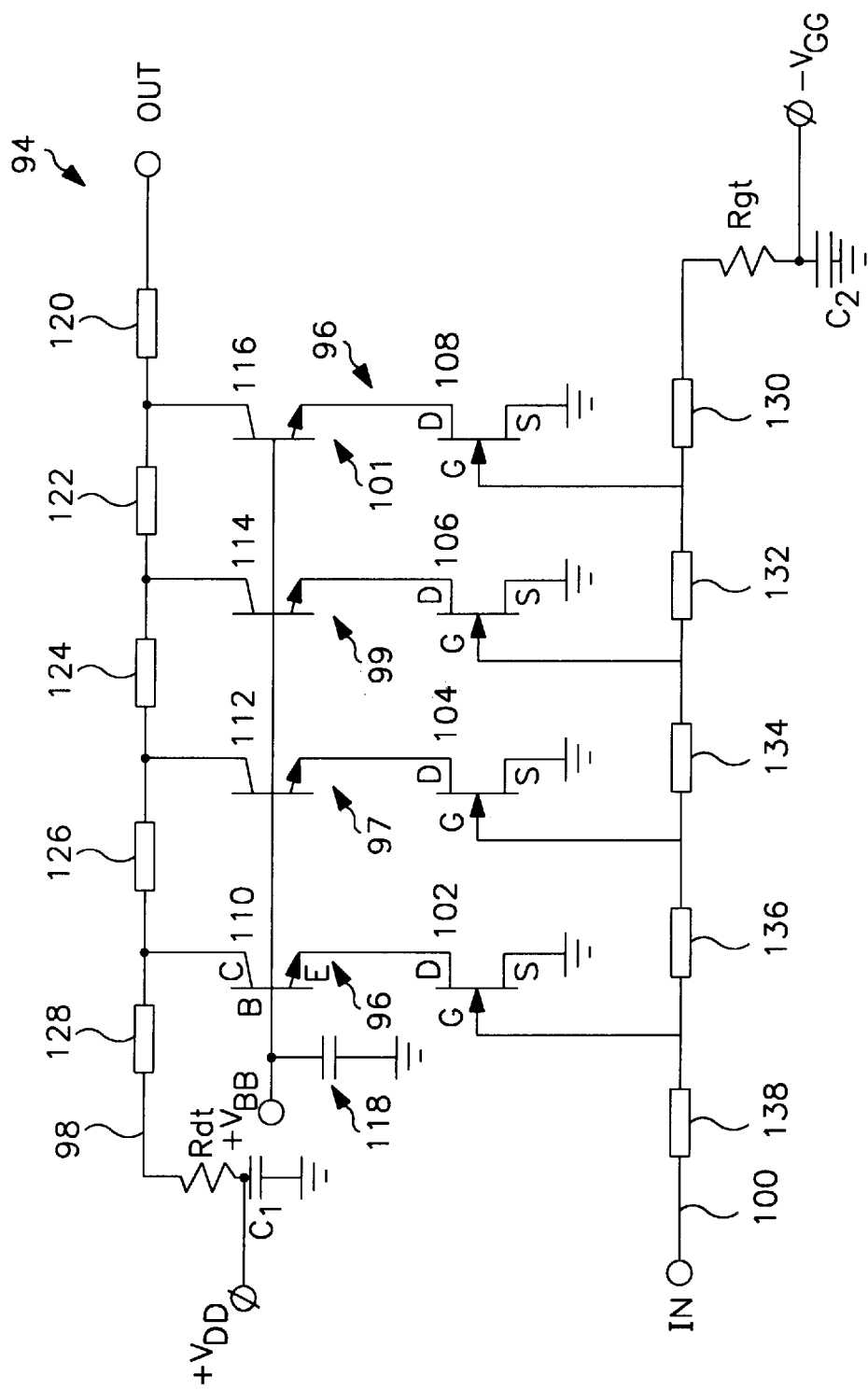
FIG. 3 is a simplified schematic diagram of a HEMT-HBT cascode distributed amplifier in accordance with the present invention.

The distributed amplifier in accordance with the present invention is illustrated in FIG. 3 and generally identified with the reference numeral 94. The distributed amplifier 94 is shown with AC grounding capacitors $C_1$ and $C_2$ as well as gate and drain bias voltages $V_{DD}$ and $V_{GG}$. The distributed amplifier 94 is formed with a plurality of stages, for example, four stages 96, 97, 99 and 101. Each stage 96, 97, 99 and 101 includes a field effect transistor (FET), preferably, a high electron mobility transistor (HEMT) 102, 104, 106 and 108, having gate, drain and source terminals. Each stage 96, 97, 99 and 101 further includes a heterojunction bipolar transistor (HBT) 110, 112, 114, 116 having base collector and emitter terminals. The HBTs 110, 112, 114 and 116 are configured in a common base configuration. In other words, the base terminals of the HBTs 110, 112, 114 and 116 are coupled to an AC ground by way of a bypass capacitor 118. The collector terminals are coupled to inductances 120, 122, 124, 126 and 128 which, in conjunction with the capacitances of the HBTs 110, 112, 114 and 116 simulate what is known as a "constant k" transmission line 98. The collector terminals of the HBTs 110, 112, 114 and 116 are connected to AC ground by way of a termination resistor $R_{DT}$, selected to have a value generally equal to the characteristic impedance of the simulated transmission line 98. The collector terminals are also coupled through the output transmission line to the output terminal OUT.

The emitter terminals of each of the HBTs 110, 112, 114 and 116 are connected to the drain terminals of each of the HEMTs 102, 104, 106 and 108. As mentioned above, the source terminals of the HEMTs 102, 104, 106 and 108 are all connected to ground, defining a common source configuration for the HEMTs.

The gate terminals for each of the HEMTs 102, 104, 106 and 108 are coupled together by way of a plurality of inductances or inductive transmission lines 130, 132, 134, 136 and 138 which, in conjunction with the gate capacitance of the HEMTs 102, 104, 106 and 108 form the simulated "constant k" transmission line 100. The gate terminals of the HEMTs 102, 104, 106 and 108 are coupled together through the transmission line elements and terminated on one end in gate termination resistor, $R_{gt}$, which is AC coupled to ground. The gate termination resistor $R_{gt}$ is selected to have a value nominally equal to the characteristic impedance of the transmission line 100. Each of the stages 96, 97, 99 and 101 forms a cascode configuration with a common source HEMT 102, 104, 106 and 108 driving a common gate HBT 110, 112, 114 and 116. More or less stages can be used.

Figure 1:
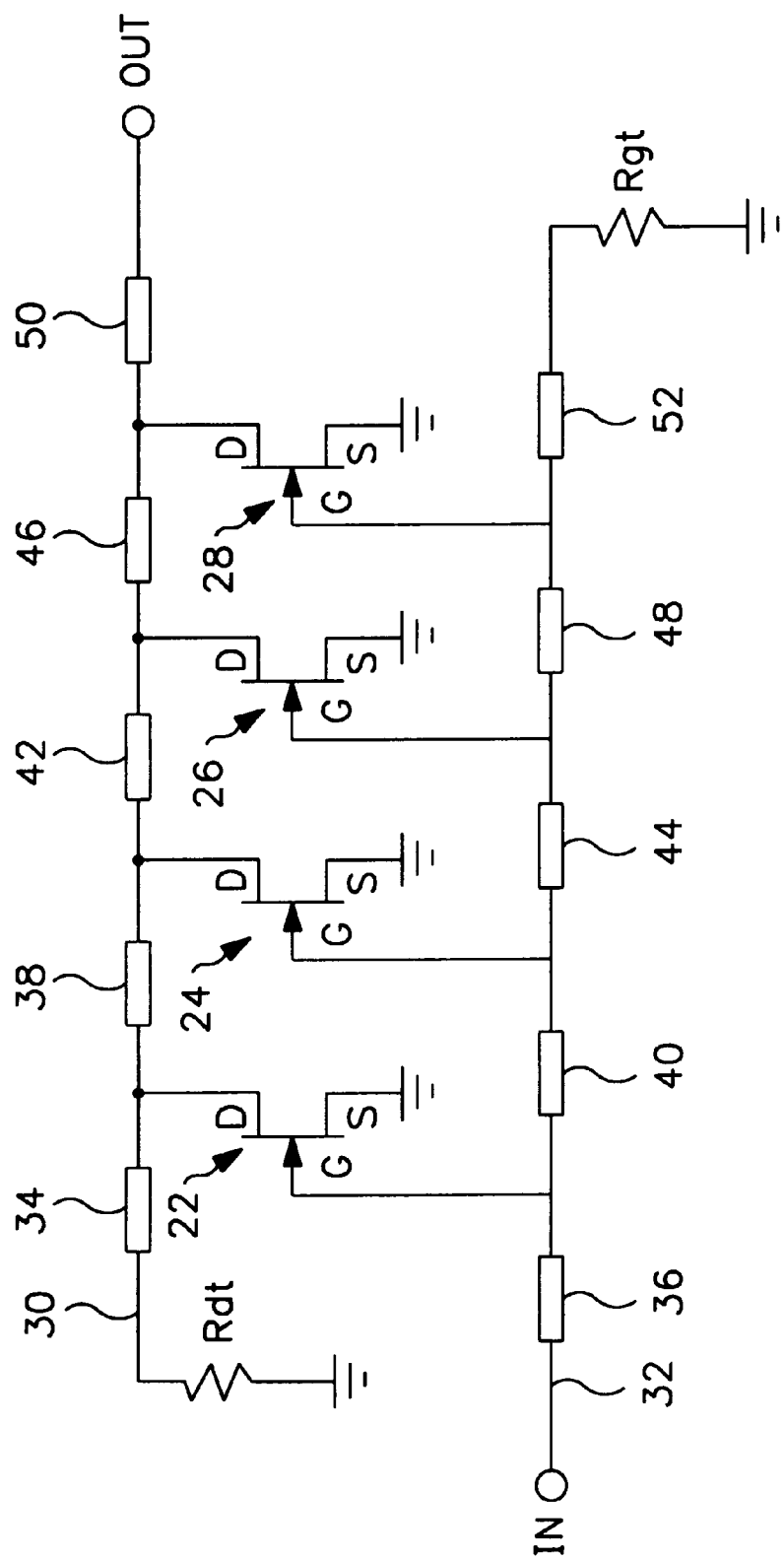
FIG. 1 is a simplified schematic diagram of a known common source FET distributed amplifier.
Figure 2:
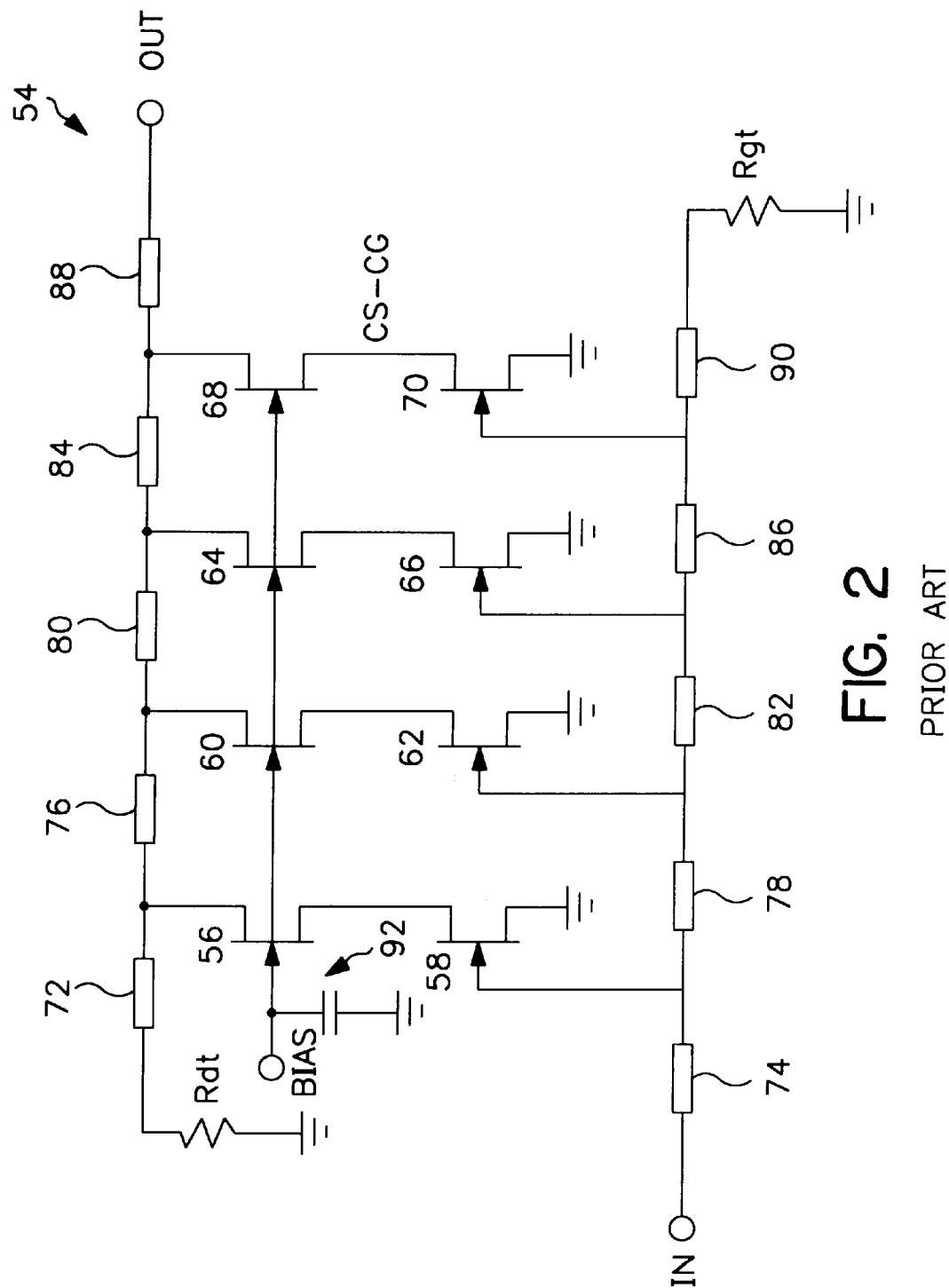
FIG. 2 is a simplified schematic diagram of a known FET cascode distributed amplifier.

The cascode configuration illustrated in FIG. 3 has the potential for providing improved results over other known configurations in many respects. In particular, since the input impedance of the common base HBT illustrated in FIG. 3 is relatively smaller than that of the common gate FET illustrated in FIG. 2, due to the relatively higher transconductance of the HBT for a given bias current, the circuit in FIG. 3 provides for relatively better suppression of the Miller effect thus enabling independent design of the input and output lines. Another aspect of the distributed amplifier in accordance with the present invention is that HBTs have high output resistance, due to the lack of any significant base width modulation. This is brought about by the high doped base region generally found in HBTS. In a common base, or cascode configuration, the output resistance is even higher still, allowing the device to form a near perfect "constant-k" transmission line at the output. As such, by minimizing output line losses, the configuration provides the potential for an increase in the number of distributed stages and thus provides the potential for higher gain.

An important aspect of the present invention is the relatively higher breakdown voltage of the HBT, which provides for increased RF output power. In particular, the overall breakdown voltage is not that of the HEMT, with a breakdown voltage $BV_{GDO}$ of approximately 3 V (for this particular process), but rather that of the common base HBT with a breakdown voltage $BV_{CBO}$ of approximately 22 v. Since by far the majority of the output voltage swing is across the common base HBT in a cascode, the small breakdown voltage of the HEMT is of no great consequence. As such, the distributed amplifier 94 is able to provide much larger voltage swings at the output and, thus, allows the circuit to be used in relatively broad band power applications. For example, if the voltage swing is twice as large at the output, an ×4 increase in RF power can be achieved.

While HEMTs are generally faster devices than HBTs, the HBTs in the distributed amplifier 94 provide relatively broad band performance due to their common base connections. In particular, in the cascode configuration, the, common base HBT effectively functions as an impedance transformer and as a unity gain current amplifier, merely taking the current delivered by the HEMT and providing it to the load. Thus, the common base current gain cut off frequency $f_\alpha$, becomes the dominant high frequency figure of merit. The alpha cut-off frequency $f_\alpha$ is closely related to the common emitter short-circuit unity current gain frequency, $f_T$ and is affected in the same manner by the same geometric, doping and biasing parameters. Unlike the common emitter configuration where a bipolar transistor amplifier's bandwidth is generally limited to below $f_T$ (or $f_\alpha$), in the common base configuration the device is broadband to frequencies very close to $f_\alpha$. As such, methods of improving the $f_T$ of the HBT in the cascode configuration, even at the expense of other HBT device parameters, provides beneficial results.

An important consideration in distributed amplifier design is minimization of the input and output line losses in order to improve the gain and bandwidth. The distributed amplifier 94 includes HEMTs and HBTS. The HEMT is the best design choice for reducing input line losses due to its nearly perfect capacitive input, while the HBT is superior at the output because of its high output impedance dominated by a small capacitance. These factors, combined with the intrinsic benefits of a cascode configuration and high breakdown voltage, make the HEMT-HBT cascode distributed amplifier superior to known distributed amplifiers for microwave integrated circuit (MMIC), a distributed amplifier 94 may be constructed in MMIC form. The integration of HBTs and HEMTs on the same substrate is disclosed in U.S. patent application Ser. No. 08/333,538, filed on Nov. 2, 1994, assigned to the same Assignee as the Assignee of the present invention and is hereby incorporated by reference.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A distributed amplifier comprising:
    a plurality of amplifier stages, each amplifier stage including one or more predetermined field effect type transistors which includes gate, drain and source terminals, connected in a common source configuration connected to one or more bipolar transistors in a cascode configuration said bipolar transistor having base, collector and emitter terminals connected in a common base configuration; and a plurality of predetermined impedances, said impedances coupled between amplifier stages and selected to simulate an input transmission line and an output transmission line.

2. The distributed amplifier as recited in claim 1, wherein said field effect type transistor is a high electron mobility transistor (HEMT).

3. The distributed amplifier as recited in claim 1, wherein said bipolar transistor is an HBT.

4. The distributed amplifier as recited in claim 1, wherein said base terminals of said bipolar transistors are AC coupled to ground.

5. The distributed amplifier as recited in claim 4, further including a first resistance coupled through transmission line elements between said collector terminals and AC ground, the resistance being selected to have a value nominally equal to the characteristic impedance of said output transmission line.

6. The distributed amplifier as recited in claim 1, wherein said gate terminals of said field effect type transistors are electrically coupled together through transmission line elements.

7. The distributed amplifier as recited in claim 5, further including a second resistance coupled between AC ground and said input transmission line, said second resistance being selected to have a value approximately equal to the characteristic impedance of said input transmission line.

8. The distributed amplifier as recited in claim 1, wherein said amplifier is formed as a monolithic microwave integrated circuit (MMIC).

9. A distributed amplifier comprising:

an input terminal;

a simulated input transmission line electrically coupled to said input terminal;

an output terminal;

a simulated output transmission line electrically coupled to said output terminal;

one or more cascode connected circuits electrically coupled between said simulated output transmission line and said simulated input transmission line, each cascode circuit including one or more field effect type transistors connected in a common source configuration and one or more a bipolar transistors connected in common base configuration.

10. The distributed amplifier as recited in claim 9, wherein said field effect type transistor is a high electron mobility transistor (HEMT).

11. The distributed amplifier as recited in claim 9, wherein said distributed amplifier is formed as a monolithic microwave integrated circuit (MMIC).

12. The distributed amplifier as recited in claim 9, wherein said bipolar transistor is an HBT.

13. An amplifier comprising:

a field effect transistor having gate, drain and source terminals, said field effect transistor connected in a common source configuration;

a bipolar type transistor having base collector and emitter terminals said bipolar transistor connected in a common base configuration wherein said field effect type transistor and said bipolar transistor are connected in a cascode configuration.

14. The amplifier as recited in claim 13, wherein said field effect type transistor is a high electron mobility transistor (HEMT).

15. The amplifier as recited in claim 13, wherein said bipolar transistor is a heterojunction bipolar transistor (HBT).

* * * * *